US009245984B2

(12) United States Patent
Laven et al.

(10) Patent No.: US 9,245,984 B2
(45) Date of Patent: Jan. 26, 2016

(54) REVERSE BLOCKING SEMICONDUCTOR DEVICE, SEMICONDUCTOR DEVICE WITH LOCAL EMITTER EFFICIENCY MODIFICATION AND METHOD OF MANUFACTURING A REVERSE BLOCKING SEMICONDUCTOR DEVICE

(71) Applicant: Infineon Technologies AG, Neubiberg (DE)

(72) Inventors: Johannes Georg Laven, Taufkirchen (DE); Roman Baburske, Otterfing (DE); Christian Jaeger, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/754,943

(22) Filed: Jan. 31, 2013

(65) Prior Publication Data
US 2014/0209973 A1 Jul. 31, 2014

(51) Int. Cl.
*H01L 29/739* (2006.01)
*H01L 21/04* (2006.01)
*H01L 29/66* (2006.01)
*H01L 29/06* (2006.01)
*H01L 29/08* (2006.01)

(52) U.S. Cl.
CPC ............ *H01L 29/7393* (2013.01); *H01L 21/04* (2013.01); *H01L 29/0634* (2013.01); *H01L 29/0834* (2013.01); *H01L 29/6634* (2013.01); *H01L 29/7397* (2013.01)

(58) Field of Classification Search
CPC ............ H01L 29/7393; H01L 29/0834; H01L 29/0634; H01L 29/6634; H01L 29/7397; H01L 21/04; H01L 29/7395; H01L 29/7396; H01L 29/32; H01L 29/36; H01L 29/6633
USPC .......................... 257/475, E29.027–E29.028, 257/E29.066–E29.067, E29.194–E29.202
See application file for complete search history.

(56) References Cited

U.S. PATENT DOCUMENTS

| 5,171,696 | A * | 12/1992 | Hagino | 438/138 |
|---|---|---|---|---|
| 5,360,984 | A * | 11/1994 | Kirihata | 257/143 |
| 6,768,168 | B1 * | 7/2004 | Takahashi | 257/330 |
| 2007/0072359 | A1 * | 3/2007 | Takei et al. | 438/234 |
| 2008/0135871 | A1 * | 6/2008 | Ruething et al. | 257/139 |
| 2010/0140658 | A1 * | 6/2010 | Koyama et al. | 257/140 |
| 2011/0227187 | A1 * | 9/2011 | Oonishi | 257/475 |
| 2012/0018846 | A1 * | 1/2012 | Baburske et al. | 257/587 |
| 2012/0025874 | A1 * | 2/2012 | Saikaku et al. | 327/109 |

* cited by examiner

*Primary Examiner* — Jae Lee
*Assistant Examiner* — Mohammed R Alam
(74) *Attorney, Agent, or Firm* — Murphy, Bilak & Homiller, PLLC

(57) ABSTRACT

A reverse blocking semiconductor device includes a base region of a first conductivity type and a body region of a second, complementary conductivity type, wherein the base and body regions form a pn junction. Between the base region and a collector electrode an emitter layer is arranged that includes emitter zones of the second conductivity type and at least one channel of the first conductivity type. The channels extend through the emitter layer between the base region and the collector electrode and reduce the leakage current in a forward blocking state.

21 Claims, 9 Drawing Sheets

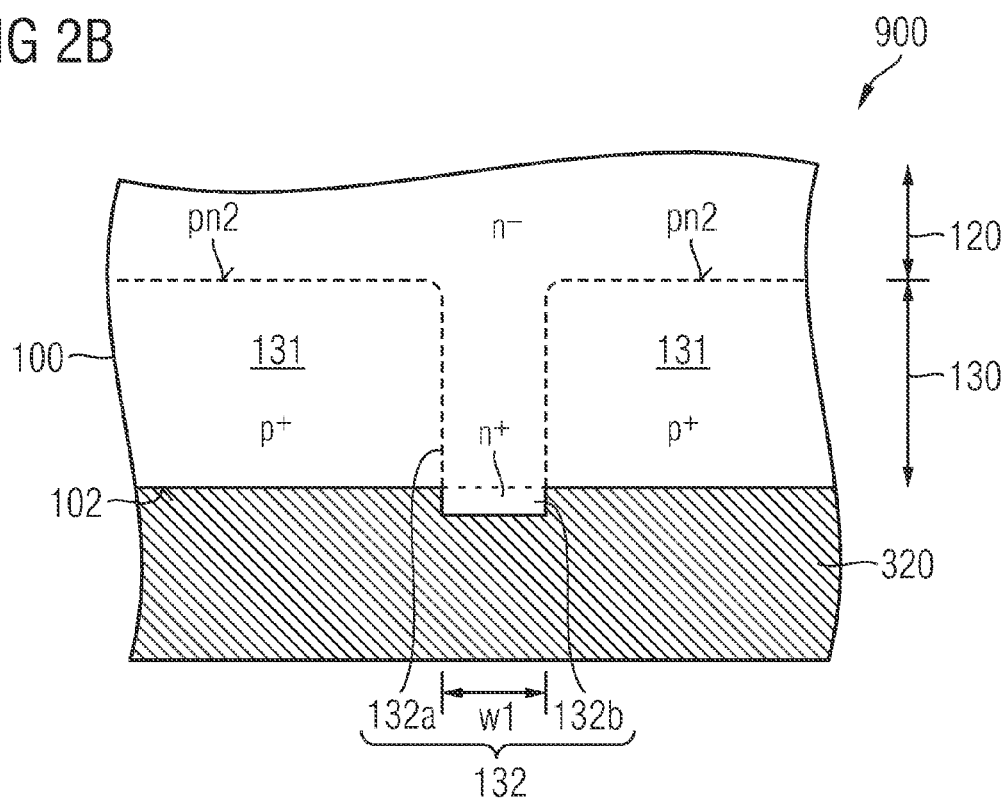
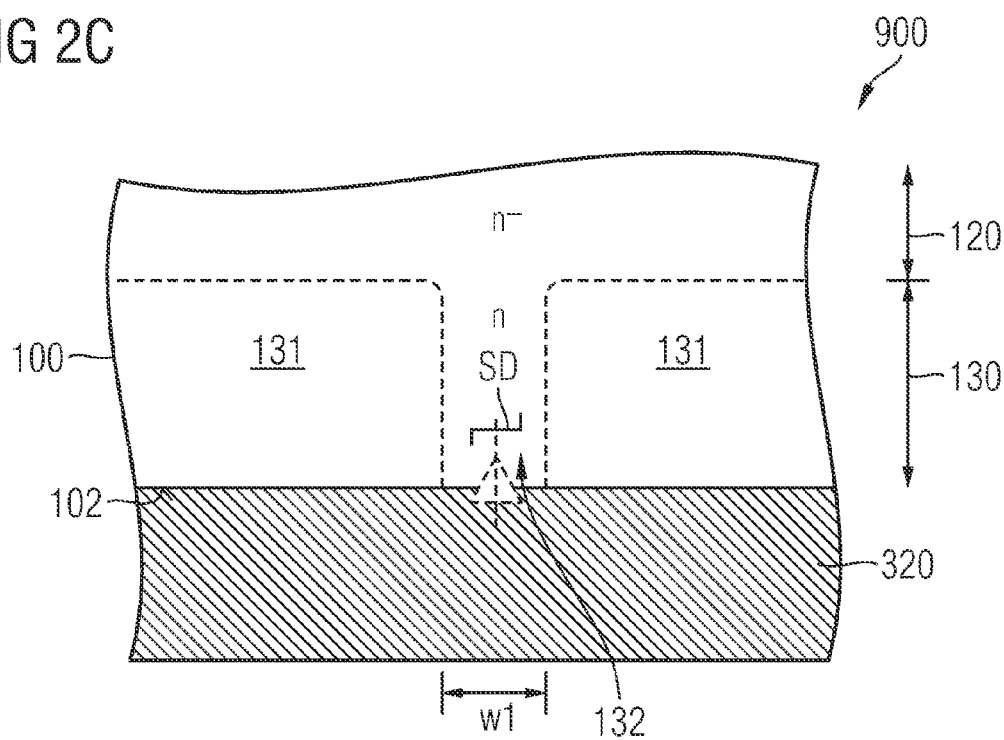

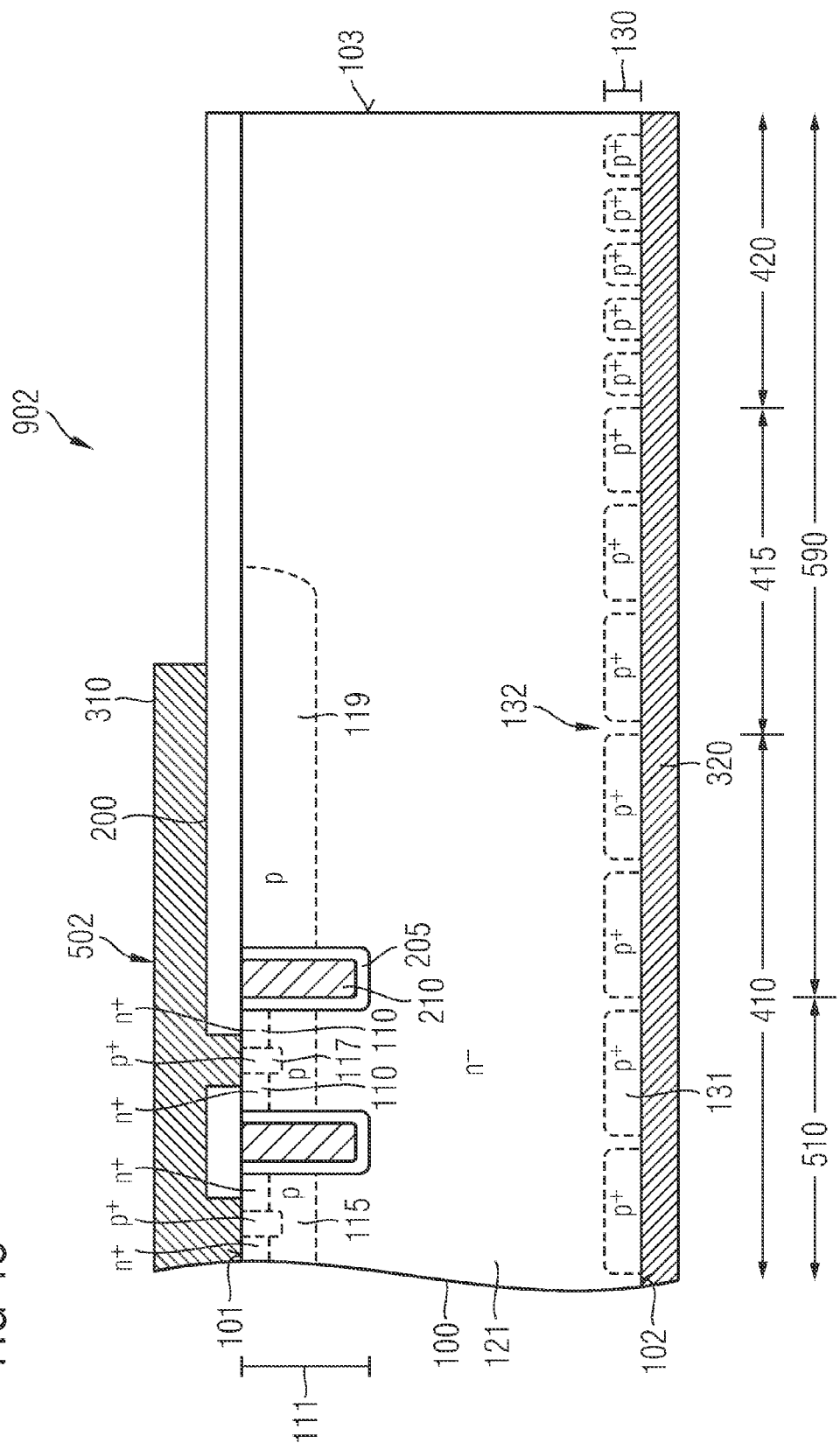

REVERSE BLOCKING SEMICONDUCTOR DEVICE, SEMICONDUCTOR DEVICE WITH LOCAL EMITTER EFFICIENCY MODIFICATION AND METHOD OF MANUFACTURING A REVERSE BLOCKING SEMICONDUCTOR DEVICE

BACKGROUND

While RC-IGBTs (reverse conducting insulated gate bipolar transistors), which monolithically integrate a free-wheeling diode that is conductive when the RC-IGBT is reverse biased, are typically used in motor control units, other applications, e.g. power converters, require switches that block the voltage in both directions. Such non reverse conducting or reverse blocking IGBTs are able to withstand a short circuit current for several microseconds. It is desirable to provide IGBTs and other semiconductor devices with enhanced short circuit strength.

SUMMARY

According to an embodiment, a reverse blocking semiconductor device includes a base region of a first conductivity type and a body region of a second, complementary conductivity type, wherein the base and body regions form a pn junction. Between the base region and a collector electrode an emitter layer includes emitter zones of the second conductivity type and at least one channel of the first conductivity type. The channel extends through the emitter layer between the base region and the collector electrode.

According to another embodiment, a semiconductor device includes a base region of a first conductivity type and a body region of a second, complementary conductivity type, wherein the base and body regions form a pn junction. Between the base region and a collector electrode an emitter layer includes emitter zones of the second conductivity type and at least one channel of the first conductivity type. The channel extends through the emitter layer between the base region and the collector electrode and forms a Schottky contact with the collector electrode.

According to another embodiment, a semiconductor device includes a base region of a first conductivity type and a body region of a second, complementary conductivity type, wherein the base and body regions form a pn junction. Between the base region and a collector electrode an emitter layer includes emitter zones of the second conductivity type and channels of the first conductivity type. The channels extend through the emitter layer between the base region and the collector electrode. A channel population density in a first section of the emitter layer is lower than in a second section.

Another embodiment refers to a method of manufacturing a reverse blocking semiconductor device. Impurities of a first conductivity type are introduced into a semiconductor substrate of the first conductivity type through a process surface to obtain a process layer extending into the semiconductor substrate up to a first depth. Through openings of an impurity mask provided on the process surface impurities of a second, complementary conductivity type are introduced into the semiconductor substrate to obtain emitter zones extending into the semiconductor substrate up to a second depth greater than the first depth and channels of the first conductivity type between the emitter zones. Exposed portions of the process layer above the emitter zones are removed.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2B is a schematic cross-sectional view of a portion of a semiconductor device in accordance with an embodiment providing an ohmic contact between the channel and the collector electrode.

FIG. 2C is a schematic cross-sectional view of a portion of a semiconductor device in accordance with an embodiment providing a Schottky contact between the channel and the collector electrode.

FIG. 4C is a schematic cross-sectional view of a portion of an IGBT with an edge region in accordance with an embodiment referring to a local variation of emitter efficiency.

DETAILED DESCRIPTION

Figure 1:
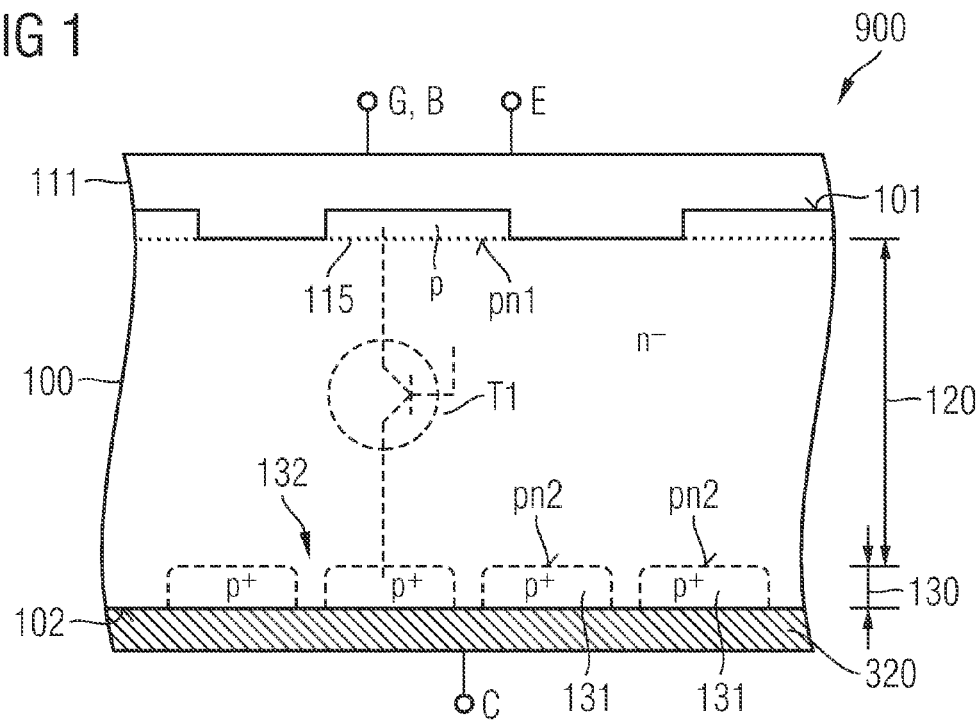
FIG. 1 is a schematic cross-sectional view of a portion of a semiconductor device with emitter zones and channels according to an embodiment.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

The Figures illustrate relative doping concentrations by indicating "−" or "+" next to the doping type "n" or "p". For example, "n$^-$" means a doping concentration, which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. The semiconductor device 900 shown in FIG. 1 may be a BJT (bipolar junction transistor), a thyristor or any type of non reverse conducting IGBT, including—but not limited to—IGBTs with enhanced reverse blocking capabilities denominated as "RB-IGBTs" (reverse-blocking IGBT) by some authors. In the following the term "reverse blocking" is to be understood as a synonym for "non reverse conducting".

The semiconductor device 900 is based on a semiconductor portion 100 provided from a single-crystalline semiconductor material, for example silicon Si, silicon carbide SiC, germanium Ge, a silicon-germanium crystal SiGe, gallium nitride GaN or gallium arsenide GaAs. In the semiconductor portion 100 a base region 120 of a first conductivity type and one or more body regions 115 of the complementary second conductivity type form first pn junctions pn1.

A control structure 111 oriented along a first surface 101 of the semiconductor portion 100 is electrically coupled to an emitter terminal E and controls the flow of mobile charge carriers through the body region 115 into or out from the base region 120. The control structure 111 may be or may include planar or trench-type IGFET (insulated gate field effect transistor) cells with the base region 120 acting as the drain of the IGFET cells and with a gate electrode of the IGFET electrically connected to a gate terminal G. According to embodiments referring to BJTs the control structure 111 may include an electrical connection between a base terminal B and the base region 120 and an electrical connection between the emitter terminal E and the body region 115, which is effective as the emitter of the BJT.

A collector electrode 320 directly adjoins a second surface 102, which is opposite to the first surface 101. The collector electrode 320 consists of or contains as main constituent aluminum Al or copper Cu or contains alloys of aluminum and/or copper, for example AlSi, AlCu, or AlSiCu. The collector electrode 320 may contain one, two, three or more sub-layers. One or more of the sub-layers may contain, as main constituent, at least one of nickel Ni, titanium Ti, silver Ag, gold Au, platinum Pt and palladium Pd. For example, a sub-layer may contain a metal silicide, metal nitride, or a metal alloy containing Ni, Ti, Ag, Au, Pt, and/or Pd.

An emitter layer 130 is sandwiched between the base region 120 and the collector electrode 320 and directly adjoins both. The emitter layer 130 includes emitter zones 131 of the second conductivity type and channels 132 of the first conductivity type. The doping level in the channels 132 may be the same as the doping level in the base region 120, but it may also be different.

The emitter zones 131 and the base region 120 form second pn junctions pn2. A mean net impurity concentration (doping level) in the emitter zones 131 may be between 1e16 cm$^{-3}$ and 1e19 cm$^{-3}$, by way of example.

The channels 132 extend between the base region 120 and the collector electrode 320. A cross-section of the channels 132 parallel to the second surface 102 may be a circle, an ellipse, an oval, a rectangle, e.g. a square, without rounded corners or a rectangle, e.g. a square, with rounded corners. According to another embodiment the channels 132 may be significantly, i.e. at least 10 times, longer than wide. Other than complementary doped emitter shorts between emitter zones in RC-IGBTs, the channels 132 are designed such that they do not short—circuit the emitter zones 131 in the reverse blocking state.

According to an embodiment, the net impurity concentration in a portion of the channel 132 directly adjoining the collector electrode 320 is sufficiently low such that the channels 132 and the collector electrode 320 form Schottky contacts that are reverse biased in the reverse blocking state. In this case a full local depletion is not absolutely necessary due to a space charge region induced by the Schottky contact. According to another embodiment dimensions of and impurity concentrations in the channel 132 are specified such that at least a vertical section of the channel 132 is fully depleted in the reverse blocking state.

The channels 132 may be designed sufficiently narrow and with sufficiently low mean net impurity concentration such that they do not adversely affect the forward conducting capability at base currents which are typical in the forward conducting state in standard applications.

In a reverse blocking state thermally generated charge carriers corresponding to the first conductivity type are generated at or may pass through the forward biased first pn junctions pn1 and are effective as a base current of an intrinsic bipolar junction transistor T1 formed by the two pn junctions pn1, pn2. The channels 132 short-circuit the emitter zones 131 for a portion of the base current. The short-circuited portion of the base current does not contribute to the control of the bipolar junction transistor T1. The gain of the bipolar junction transistor T1 and the leakage current ruled by the intrinsic bipolar junction transistor T1 are significantly reduced. As a result overall reverse blocking losses are reduced without adversely affecting significantly the forward conduction and forward blocking capabilities. This holds for the normal operation mode and the operation at elevated temperatures For example, after having changed from a short-circuit state, during which the semiconductor device 900 is heated up, to the forward blocking state, an additional thermal stress resulting from the forward leakage current and the risk of a thermal runaway are significantly reduced as outlined in more detail below.

In the following the first conductivity type is assumed to be the n-type and the second conductivity type is assumed to be the p-type. Equivalent considerations apply to embodiments with the first conductivity type being the p-type and the second conductivity type being the n-type.

Figure 2A:
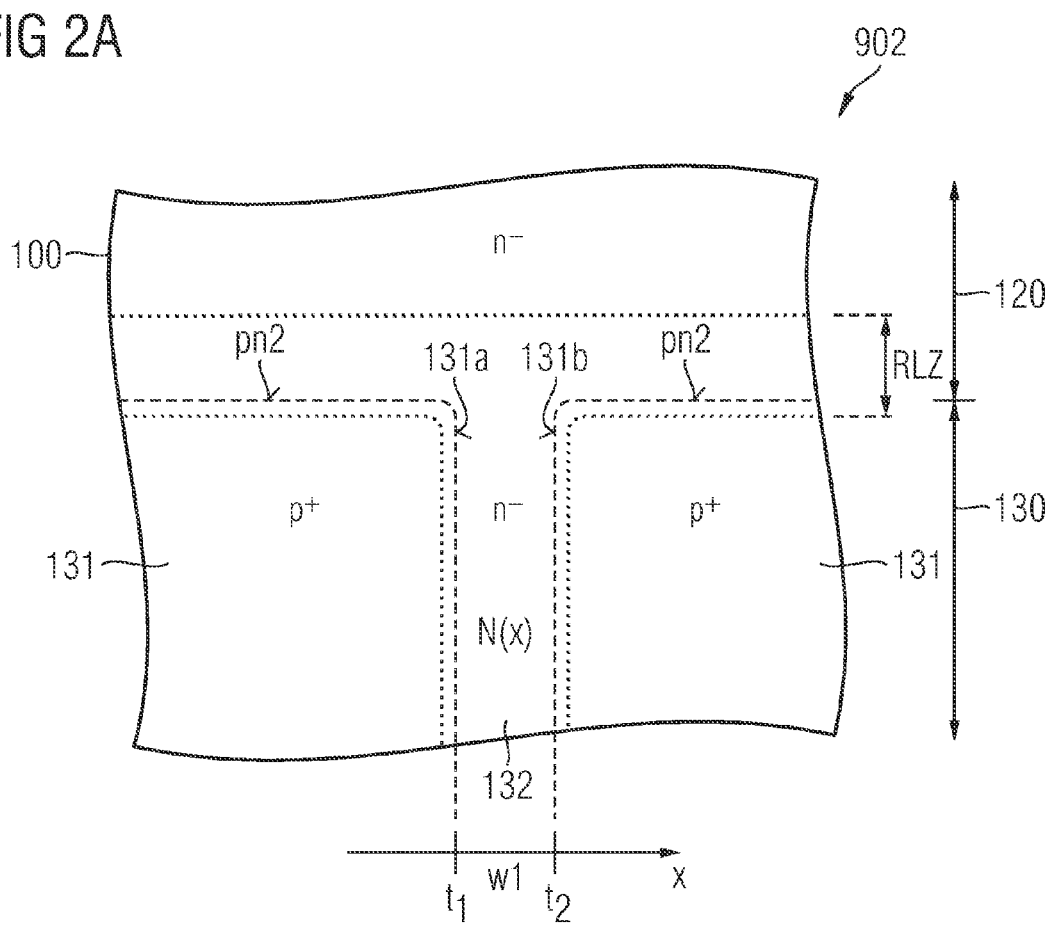
FIG. 2A is a schematic cross-sectional view of a portion of a semiconductor device in accordance with an embodiment providing a completely depleted channel.

FIG. 2A refers to an embodiment with the whole channel 132 of an n-channel IGBT 902 being depleted in the reverse blocking state with a negative voltage applied between the collector and emitter terminals. The negative voltage produces depletion zones RLZ along the second pn junctions pn2 between the p-doped emitter zones 131 and the n-doped base region 120 as well as between the p-doped emitter zones 131 and the channel 132. The depletion zones RLZ extend deeper into the low doped channel 132 than into the heavily doped emitter zones 131. The depletion zones RLZ assigned to opposing sidewalls 131a, 131b of the emitter zones 131 merge with each other such that the channel 132 is completely depleted in the reverse blocking state and in an idle state with no voltage applied between the collector and emitter terminals. No or only few electrons pass through the channel 132.

For completely depleting the channel 132 in the reverse blocking state, a net amount of n-type impurities (donators) in the channel 132 is much less than the net amount of p-type impurities (acceptors) in first portions of the emitter zones 131 adjoining to the channel 132. According to an embodiment, a net impurity concentration in the channel 132 is selected such that at least in a vertical section of the channel 132 an integral over the net impurity concentration along a line parallel to the second surface 102 between opposing sidewalls of the channel 132 results in an area charge AC between $1\times10^{10}$ cm$^{-2}$ and $1\times10^{11}$ cm$^{-2}$. According to an embodiment the area charge is at most $2\times10^{10}$ cm$^{-2}$. Equation (1) gives the area charge AC as a function of the impurity profile N(x) between the first sidewall at x=x1 and the second sidewall x=x2.

$$AC = \int_{x1}^{x2} N(x)dx \quad (1)$$

The channel 132 may be significantly narrower than the emitter zones 131. According to an embodiment, the width in the narrowest portion of the channel 132 is at most 1 μm.

In the forward blocking state electrons generated by electron excitation in the base region 120 or along the reverse-biased first pn junction pn1 represent a base current for the intrinsic bipolar junction transistor T1 of FIG. 1. Amplified by the gain of the bipolar junction transistor T1 the base current results in a leakage current of the n-channel IGBT 902 in the forward blocking state. Since the charge carrier generation is low at normal operation conditions below 150 degree Celsius, the leakage current and leakage losses are low enough such that the temperature of the IGBT does not rise.

On the other hand, many applications for reverse blocking semiconductor devices require that the semiconductor device 900 withstands a short-circuit condition for some microseconds. During the short-circuit condition, the ohmic conduction losses may heat up the semiconductor device to 200 degree Celsius and more. Since the charge carrier generation rate strongly depends on the temperature, the base current increases accordingly and the losses resulting from the increased leakage current may further rise the device temperature resulting in turn in a further increased charge carrier generation rate. The device is exposed to increasing thermal stress which can destroy the device even some milliseconds after the device has recovered from the short-circuit condition (thermal runaway). The minimum temperature at which the losses resulting from the increased charge carrier generation rate are higher than the thermal energy the device can dissipate to the ambient gives the critical temperature that the device must not reach during the short-circuit condition.

The channels 132 purge the charge carriers without a voltage drop induced at the second pn junctions pn2 that becomes high enough to trigger the injection of holes into the base region 120. In other words, the channels 132 reduce the gain of the intrinsic bipolar junction transistor T1 such that at the same charge carrier generation rate the leakage current is reduced. Since the leakage current is reduced, the leakage current can trigger a thermal runaway only at a higher temperature. Hence, the critical temperature is shifted to higher values. Since the device is allowed to reach a higher temperature, the device can absorb more thermal energy during the short-circuit condition. As a consequence, the device can be specified for a longer short-circuit period at the same maximum short-circuit current or for a higher short-circuit current for the same short-circuit period.

Whereas in conventional n-channel IGBT devices the electron channel of the control structure 111 is designed such that the maximum short-circuit current cannot heat up the device to the critical temperature, the embodiments of the present invention give more leeway for adapting the electron channel to other application requirements.

In FIG. 2B a channel 132 of an n-channel semiconductor device 900 comprises a low doped portion 132a and a heavily doped portion 132b sandwiched between the low doped portion 132a and the collector electrode 320. The mean net impurity concentration in the heavily doped portion 132b may be between $1\times10^{19}$ cm$^{-3}$ and $5\times10^{20}$ cm$^{-3}$, for example about $5\times10^{19}$ cm$^{-3}$ such that the channel 132 and the collector electrode 320 provide an ohmic contact. The width w1 of the channel 132 is selected such that in the reverse blocking state depletion zones formed along vertical portions of the second pn junctions pn2 merge in the channel 132 and the channel 132 does not deteriorate the reverse blocking capability.

In FIG. 2C a low doped channel 132 of an n-channel semiconductor device 900 directly adjoins the collector electrode 320. The mean net impurity concentration in the channel 132 in a region directly adjoining to the collector electrode 320 may be between $1\times10^{12}$ cm$^{-3}$ and $1\times10^{17}$ cm$^{-3}$, for example about $1\times10^{14}$ cm$^{-3}$ such that the interface between the channel 132 and the collector electrode 320 is effective as a Schottky contact SD. The mean net impurity concentration in the channel 132 is significantly lower than the net impurity concentration in emitter shorts in RC-IGBTs.

In the reverse blocking state, a negative voltage applied between the collector electrode and the emitter terminal reverse biases the Schottky contact SD. The Schottky contact is effective as a reverse-biased diode such that the channel 132 blocks and does not deteriorate the reverse blocking capability. The embodiment of FIG. 2C may provide lower reverse leakage currents and reverse conductivity than the embodiment of FIG. 2B. The reverse blocking capability of the Schottky contact SD does not depend on the channel width w1. Hence the channel width w1 may be increased such that the forward leakage current may further be reduced. The maximum impurity concentration in the channel 132 which allows a Schottky contact depends on the material of a sublayer of the collector electrode 320 directly adjoining the emitter layer 130.

According to an embodiment, a sub-layer consisting of or containing aluminum directly adjoins the emitter layer 130 and the mean net impurity concentration in the channel 132 is between $10^{12}$ cm$^{-3}$ and $10^{19}$ cm$^{-3}$, e.g. $10^{14}$ cm$^{-3}$.

Figure 2D:
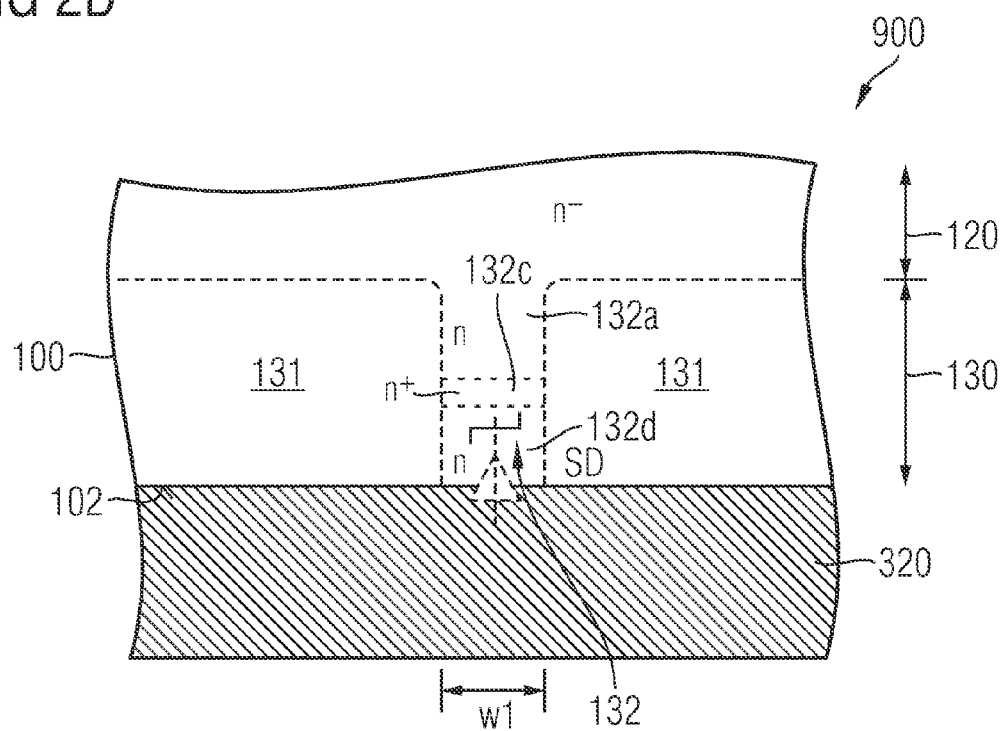
FIG. 2D is a schematic cross-sectional view of a portion of a semiconductor device in accordance with an embodiment providing a Schottky contact and an additional layer spaced from the Schottky contact.

The embodiment of FIG. 2D provides an additional layer 132c having the conductivity type of the channel 132 between the low-doped portion 132a and the Schottky contact SD to avoid a direct contact between the space charge layer and the Schottky contact SD. The additional layer 132c may be implanted between the Schottky contact SD and the low-doped portion 132a. According to an embodiment, the additional layer 132c may directly adjoin the Schottky contact SD, whereby the doping level of the additional layer 132c is higher than the doping level of the low-doped portion 132a and lower than a maximum doping level for obtaining a Schottky contact SD. The doping concentration of the additional layer 132c may be e.g. between $10^{15}$ and $10^{19}$ donors per cm$^3$. The doping level of the additional layer 132c may be constant in the vertical direction or it may vary.

According to the illustrated embodiment, a low-doped spacer zone 132d of the conductivity type of the channel 132 separates the additional layer 132c from the Schottky contact SD within the channel 132. A doping level of the spacer zone 132d may be approximately the same as the doping level in the low-doped portion 132a. The doping level in the additional layer 132c can be higher than allowed for obtaining a Schottky contact.

Figure 3A:
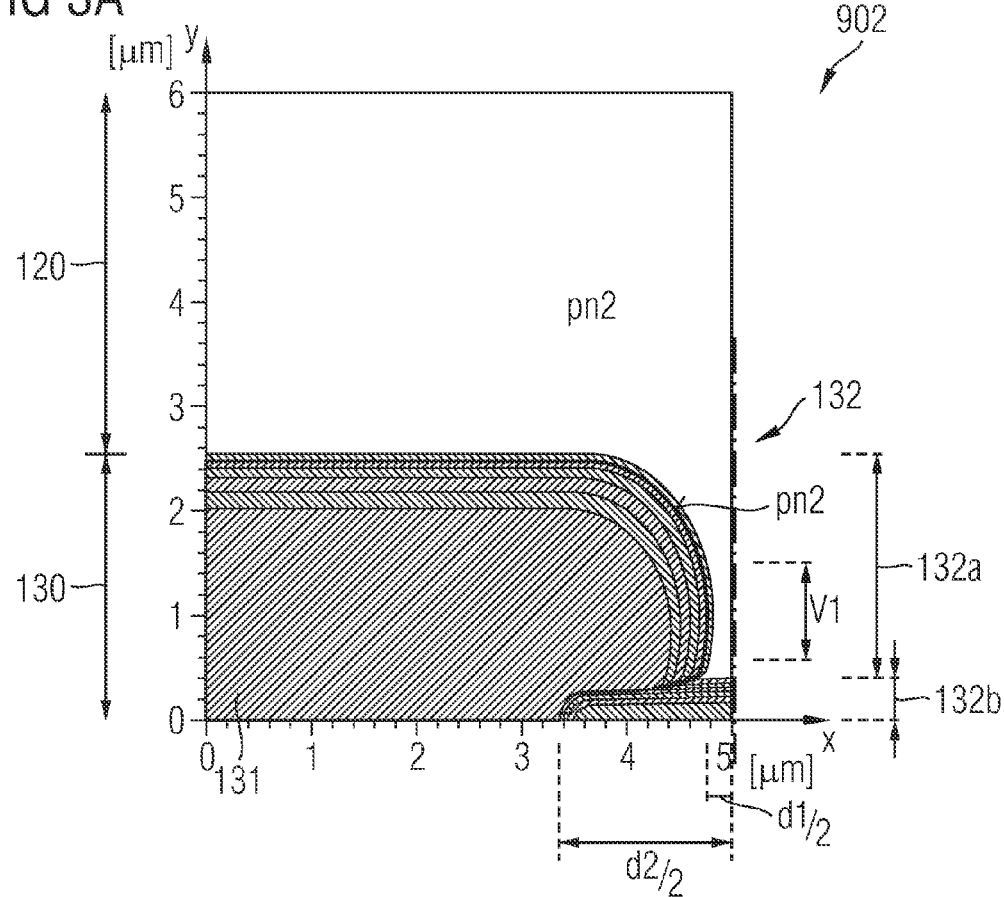
FIG. 3A is a schematic cross-sectional view of a portion of a semiconductor device in accordance with an embodiment providing a channel with a lateral contraction.

FIGS. 3A to 3D refer to an n-channel IGBT 902 providing a channel 132 with a circular cross-section and with a lateral constriction in a vertical section V1 in the low-doped portion 132a as shown in FIG. 3A. The heavily doped portion 132b has a second diameter d2 greater than the first diameter d1 of the low-doped portion 132a, for example at least twice the first diameter d1. According to the illustrated embodiment, the second diameter d2 is about five times the first diameter d1. With a first diameter d1 of the narrowest portion of the low-doped portion 132a being at most 1 μm and with an area charge AC as defined in equation (1) about $1.44\times10^{10}$ cm$^{-2}$, the vertical section V1 is completely depleted such that the reverse blocking capability is maintained.

Figure 3B:
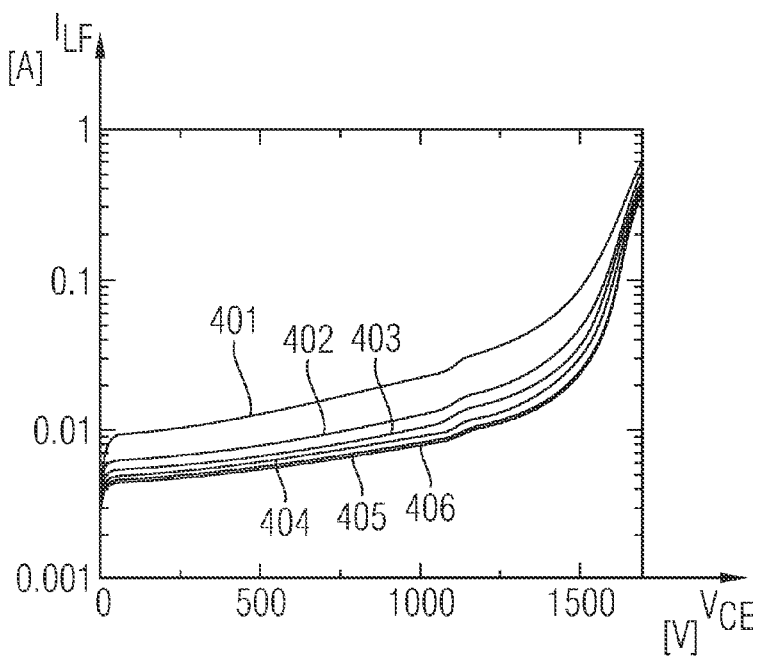
FIG. 3B is a schematic diagram illustrating the forward blocking capability of the semiconductor device of FIG. 3A.

FIG. 3B shows the effect of the channels 132 of FIG. 3A in the forward blocking state. A set of curves 401 to 406 plots the forward leakage current $I_{LF}$ against the collector to emitter voltage $V_{CE}$ applied between the collector and emitter terminals at 200 degree Celsius. Curve 401 plots $I_{LF}$ for a diameter d2 of the heavily doped channel portion 132b equal 0.01 μm and may approximate a device without channels. Curve 402 plots $I_{LF}$ for a diameter d2 equal to 1.22 μm, curve 403 for a diameter d2 equal to 1.3 μm, curve 404 for 1.4 μm, curve 405 for 1.6 μm, and curve 406 gives the leakage current for the diameter d2 equal to 2 μm. At a diameter d2 equal to 1.3 μm corresponding to a first diameter d1 of the low doped channel portion 132a of about 0.5 μm, the leakage current is reduced by at least 50%. A further widening of the channel opening shows only little effect on the leakage current.

Figure 3C:
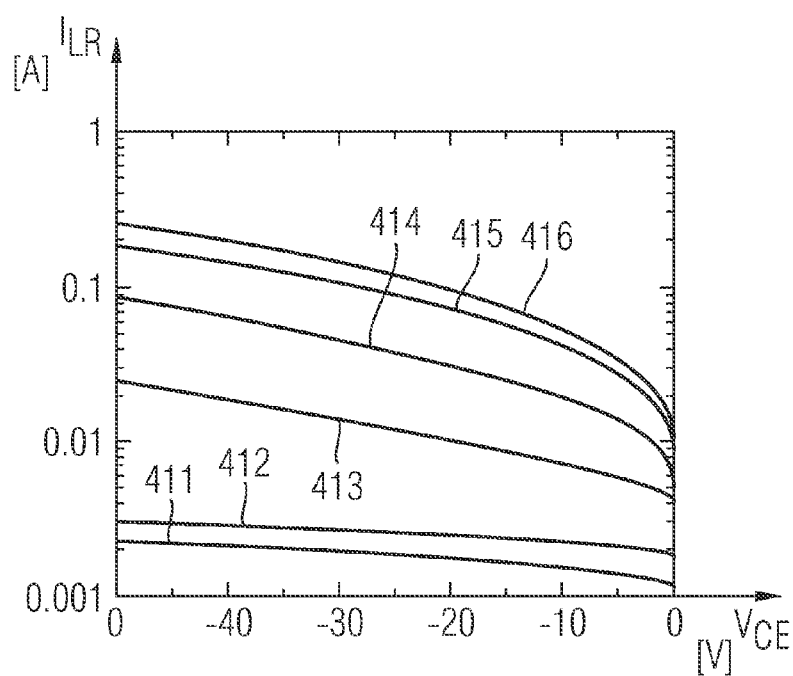
FIG. 3C is a schematic diagram showing the reverse blocking capability of the semiconductor device of FIG. 3A.

In FIG. 3C a set of curves 411 to 416 plot the reverse leakage current $I_{LR}$ against the collector-to-emitter voltage $V_{CE}$ for the diameters given by curves 401 to 406 in FIG. 3B at 200 degree Celsius. The greater the cross-sectional area of the channel is, the greater the reverse leakage current and reverse conductivity are. The increase of the reverse leakage current can be limited by keeping the channels 132 narrow enough, for example by providing the channels 132 with a narrowest diameter of at most 1 μm.

Figure 3D:
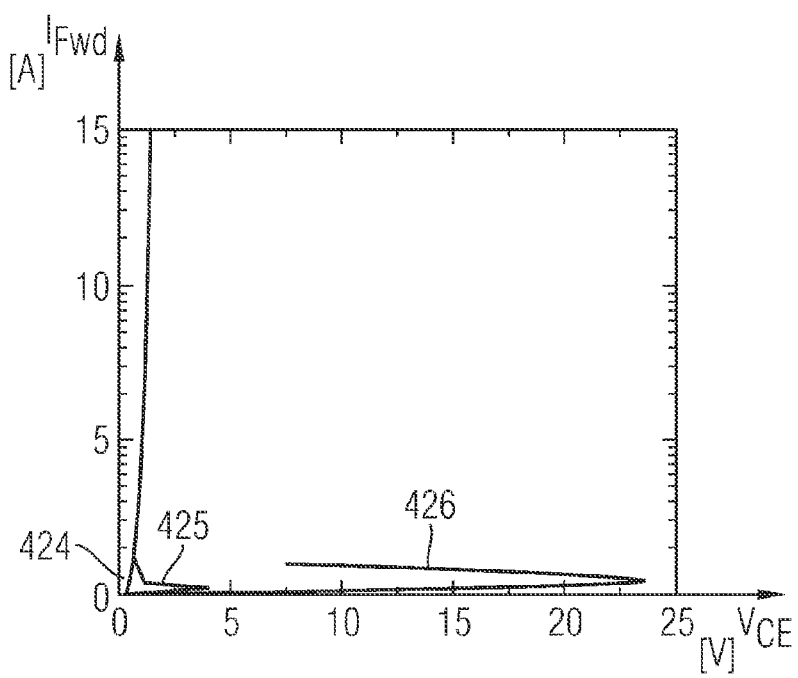
FIG. 3D is a schematic diagram illustrating the forward conduction capability of the semiconductor device of FIG. 3A.

In FIG. 3D a curve 424 plots the forward current $I_{Fwd}$ against the collector-to-emitter voltage $V_{CE}$ for a diameter d2 equal to 1.4 μm and a curve 426 plots $I_{Fwd}$ against $V_{CE}$ for d2 equal to 2.0 μm at 200 degree Celsius. In the forward state, the channels 132 represent a high resistance path parallel to the emitter zones 131. At values for the second diameter d2 below 1.6 μm, see curve 425, and an area charge AC in the channels 132 as defined in equation (1) below about $1.44\times10^{10}$ cm$^{-2}$, yet a forward current of few mA generates a voltage drop over the channels 132 that corresponds to the diode voltage of the second pn junction pn2 and an IGBT-snapback effect is not perceivable. At a diameter d2 equal to 2.0 μm a significant snap-back effect occurs.

Figure 4A:
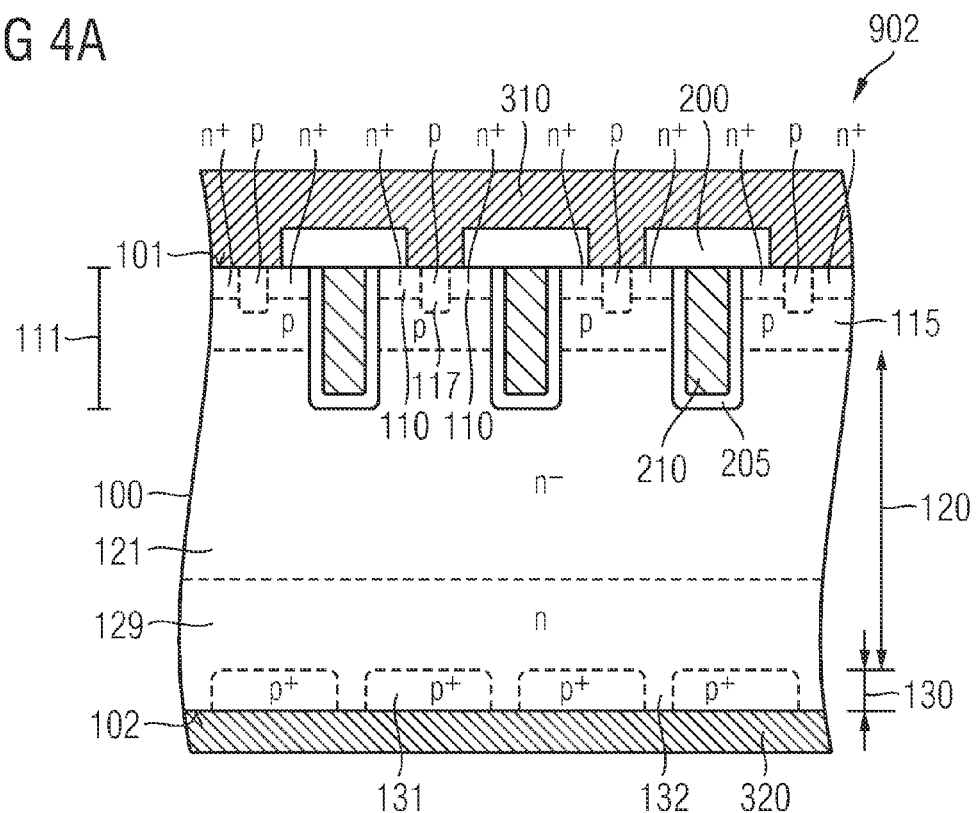
FIG. 4A is a schematic cross-sectional view of a portion of a trench-type IGBT according to another embodiment.

FIG. 4A shows a reverse blocking IGBT 902 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 40 μm, for example at least 175 μm. Other embodiments may provide semiconductor portions 100 with a thickness of several 100 μm.

The semiconductor portion 100 may have a rectangular shape with an edge length in the range of several millimeters. The normal to the first and second surfaces 101, 102 defines a vertical direction and directions orthogonal to the normal direction are lateral directions.

In the semiconductor portion 100 an emitter layer 130 directly adjoins the second surface 102. The emitter layer 130 includes p-doped emitter zones 131 and n-doped channels 132. The mean net impurity concentration in the emitter zones exceeds at least 10 times the mean net impurity concentration in the channels 132. For example, the mean net impurity concentrations in the emitter zones 131 may be at least $1\times10^{17}$ cm$^{-3}$, for example at least $5\times10^{17}$ cm$^{-3}$, whereas the mean net impurity concentration in the channels 132 is at most $1\times10^{16}$ cm$^{-3}$, for example at most $5\times10^{15}$ cm$^{-3}$.

A collector electrode 320 directly adjoins the second surface 102 and is electrically connected to the emitter zones 131. The collector electrode 320 may include at least one of aluminum Al, copper Cu as main constituent. For example, the collector electrode 320 includes an alloy of aluminum Al and copper Cu. The collector electrode 320 may or may not contain silicon Si as a further main constituent. Furthermore, thin diffusion barriers like e.g. Ti, TiW, TiN, Ta, TaN, W may be foreseen directly on the second surface 102.

According to other embodiments, the collector electrode 320 may contain one, two, three or more conductive sub-layers, wherein each sub-layer may contain, as a main constituent, at least one of nickel Ni, titanium Ti, silver Ag, gold Au, platinum Pt and palladium Pd. For example, a sub-layer may contain a metal silicide, a metal nitride, or a metal alloy containing Ni, Ti, Ag, Au, Pt, and/or Pd.

In the semiconductor portion 100, the emitter zones 131 and an n-doped base region 120 form pn junctions. The base region 120 may include an n-doped field stop layer 129 and an n-doped drift zone 121. The field stop layer 129 directly adjoins the emitter layer 130. A mean net impurity concentration in the field stop layer 129 is lower than in the emitter zones 131. For example, the mean net impurity concentration in the emitter zones 131 exceeds at least five times the mean net impurity concentration in the field stop layer 129. According to an embodiment, the mean net impurity concentration in the field stop layer 129 is between $5\times10^{14}$ cm$^{-3}$ and $1\times10^{17}$ cm$^{-3}$.

The low n-doped drift zone 121 forms an interface with the field stop layer 129, which is in substance parallel to the first and second surfaces 101, 102. The mean net impurity concentration in the drift zone 121 is lower than in the field stop layer 129. According to an embodiment, the mean net impurity concentration in the field stop layer 129 exceeds at least five times the mean net impurity concentration in the drift zone 121. The mean net impurity concentration in the drift zone 121 may be between $1 \times 10^{12}$ cm$^{-3}$ and $1 \times 10^{14}$ cm$^{-3}$, by way of example.

Buried gate structures 210 extend from the first surface 101 into the semiconductor portion 100, wherein a dielectric liner 205 separates the buried gate structures 210 from the semiconductor material of the semiconductor portion 100. The buried gate structures 210 may be parallel stripes arranged in a regular pattern. According to other embodiments, the lateral cross-sectional areas of the buried gate structures 210 may be circles, ellipsoids, ovals or rectangles, i.e. squares, with or without rounded corners, or rings. For example two buried gate structures 210 may form an arrangement with two concentric rings, wherein the rings may be circles, ellipsoids, ovals, or rectangles, e.g. squares with rounded corners.

Between the buried gate structures 210 IGFET (insulated gate field effect transistor) cells may be a control structure 111 controlling a charge carrier injection into the base region 120. In each IGFET cell a p-type body region 115 extends between the two neighboring buried gate structures 210 or within a ring-shaped buried gate structure 210. The body regions 115 form pn junctions with the drift zone 121. In each IGFET cell at least one, e.g. two n-type source zones 110 may extend from the first surface 101 into the semiconductor portion 100. One or two p-type contact zones 117 are formed between the source zones 110 and the body regions 115 and directly adjoin both of them. A maximum net impurity concentration in the contact zones 117 is significantly higher than a maximum net impurity concentration in the body regions 115. For example, the maximum net impurity concentration in the contact zones 117 exceeds at least ten times the maximum net impurity concentration in the body regions 115.

Each source zone 110 forms a pn junction with a contact zone 117 and a body region 115. The source zones 110 directly adjoin the dielectric liner 205. A potential applied to the buried gate structures 210 controls a minority charge carrier distribution in a channel portion of the body regions 115 close to the dielectric liner 205. If, in a forward biased mode, the gate potential applied to the buried gate structures 210 exceeds a predefined threshold voltage, n-type inversion channels are formed in the body regions 115 along the insulated gate electrodes and a forward current flows between the source zones 110 and the collector electrode 320.

An emitter electrode 310 extends through openings of a dielectric structure 200 and directly adjoins the first surface 101. The dielectric structure 200 dielectrically insulates the emitter electrode 310 from the buried gate structures 210. The emitter electrode 310 may be provided from aluminum Al, copper Cu, an aluminum copper alloy, with or without silicon respectively.

Channels 132 are provided according to one of the embodiments described above. The channels 132 improve the short circuit capability of the reverse blocking n-channel IGBT 902.

Figure 4B:
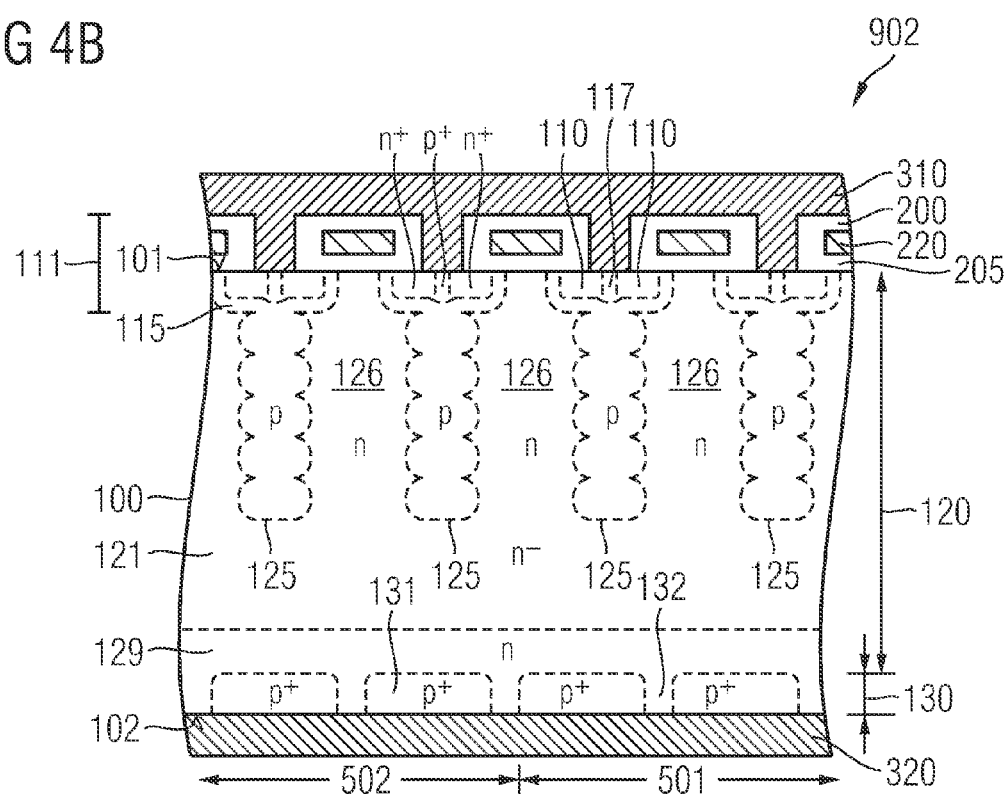
FIG. 4B is a schematic cross-sectional view of a portion of a super junction IGBT with planar gate electrodes in accordance with a further embodiment.

The embodiment of FIG. 4B widely corresponds to the embodiment of FIG. 4A. Instead of buried gate structures 210 the embodiment provides planar gate electrode structures 220 provided outside the semiconductor portion 100 and dielectrically insulated from the semiconductor portion 100 by the dielectric liner 205. In addition the drift zone 121 provides a super junction structure with vertical p-doped columns 125 structurally connected to the body regions 115. The p-doped columns 125 alternate with n-doped columns 126.

The columns 125, 126 may be parallel stripes arranged in a regular pattern. According to other embodiments, the lateral cross-sections of either the p-doped or the n-doped columns 125, 126 or of both are circles, ellipsoids, ovals or rectangles, i.e. squares, with or without rounded corners, or rings. For example a ring-shaped p-doped column may be surrounded by a concentric ring-shaped n-doped column and vice versa, wherein the rings may be circles, ellipsoids, ovals, or rectangles, e.g. squares with rounded corners.

Due to a compensation effect between the n- and p-type columns 125, 126 a high reverse blocking voltage is achieved even for comparatively high impurity concentrations in the drift zone 121. Further embodiments of a reverse blocking semiconductor device may refer to MCTs (metal oxide semiconductor controlled thyristors), MOS gated thyristors or bipolar junction transistors.

The channels 132 may be uniformly distributed in the emitter layer 130 such that the emitter efficiency is uniform in the complete emitter layer 130. According to other embodiments a local modulation of emitter efficiency by varying the distribution of the channels 132 in the emitter layer 130 tunes the device characteristics. Thereby a suitable modification of the impurity mask for the channels 132 may replace an additional impurity implant as provided in conventional approaches for local emitter efficiency modification.

FIG. 4C refers to a reverse blocking n-channel IGBT 902 with a cell area 510 and an edge area 590 surrounding the cell area 510. The cell area 510 includes IGFET cells 501, 502 with source zones 110, body regions 115, contact zones 117 and a base region 121 as described above. When the n-channel IGBT 902 is forward biased and the potential at the buried gate structures 210 exceeds a predefined threshold, a forward current flows approximately exclusively in the cell area 510 in a vertical direction between the emitter electrode 310 and the collector electrode 320.

The edge area 590 separates the cell area 510 from an outer surface 103 of the semiconductor portion 100, which is tilted to the first and second surfaces 101, 102. The edge area 590 may include a termination structure, for example a p-doped junction termination extension zone 119 and a field plate structure with a portion of the emitter electrode 310 overlapping the junction termination extension zone 119 and a portion of the dielectric structure 200 separating the junction termination extension zone 119 and the emitter electrode 310. The edge area 590 does not contain complete and functional IGFET cells 501, 502 and approximately no forward current flows in the edge area 590 in the forward conduction state.

The emitter layer 130 may include channels 132 both in the cell area 510 and in the edge area 590. According to an embodiment, the population density of the channels 132 in a first section 410 differs from the population density of channels 132 in a second section 420. For example, the channel population density in the first section 410 is lower than in the second section 420. The first section 410 may be a portion of the cell area 510, may include the cell area 510 or may coincide with the cell area 510. The second section 420 may be a portion of the edge area 590, for example an outer portion adjoining the outer surface 103, may include the edge area 590 and overlap with the cell area 510 by, for example up to two diffusion lengths, or may coincide with the edge area 590.

According to the illustrated embodiment, the channel population density may monotonically decrease in an intermediate section 415 between the first section 410 and the second section 420. The intermediate section 415 may be a portion of the cell area 510, a portion of the edge area 590 or may include portions of both the cell and edge areas 510, 590. For example, the intermediate section 415 may overlap with the cell area 510 by up to two diffusion lengths.

The high number of channels 132 in the second section 420 reduces the emitter efficiency in the edge area 590 and replaces conventional HDR (high dynamic robustness) structures aiming at reducing the number of mobile charge carriers in the edge area 590. Where conventional approaches provide at least one additional implant step for providing the HDR structure, the present embodiment gets by with a modification of the impurity mask for the channels 132. In addition, the embodiment simplifies providing a gradual modification of the emitter efficiency thereby further reducing the risk of the occurrence of local current filaments that may damage the device.

According to another embodiment first and second sections 410, 420 of different channel population density and emitter efficiency are provided within the cell area 410 according to an LEBE approach. Where conventional LEBE (locally enhanced back-side emitter) approaches provide a steep transition between a low emitter efficiency region and a high emitter efficiency region resulting in an electric field at the steep transition which can change its direction in the short-circuit mode which in turn may result in a locally increased current possibly damaging the device, the embodiment may provide a gradual modification of the emitter efficiency implying smoother electric field gradients reducing the risk of local currents damaging the device in the short-circuit case. The improved device performance can be achieved by a simple modification of the impurity mask and does not require additional process steps. In addition the channel concept can combine HDR and LEBE concepts without additional process steps.

Locally modifying the emitter efficiency by implementing channels 132 may be applied both to reverse blocking and to reverse conducting semiconductor devices, for example RC-IGBTs.

FIGS. 5A to 5D refer to the manufacture of a reverse blocking semiconductor device with channels 132. Into a process surface 102a of a weakly n-doped semiconductor substrate 100a n-type impurities are introduced, e.g. implanted, at a comparatively high implantation dose. The implantation dose may be higher than $1 \times 10^{16}$ cm$^{-2}$, by way of example. The implantation energy is selected such that a heavily n-doped process layer 438 is formed close to the process surface 102a up to a first depth. The process layer 438 extends at most 1 µm, for example less than 200 nm into the semiconductor portion 100.

Figure 5A:
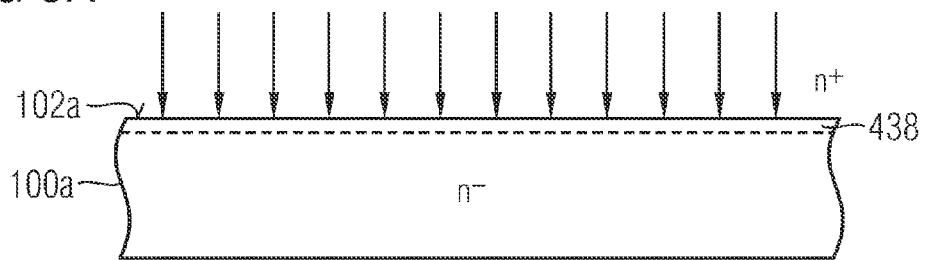
FIG. 5A is a schematic cross-section of a semiconductor substrate for illustrating a method of manufacturing a reverse blocking semiconductor device after an unmasked implant with n-type impurities.

FIG. 5A shows the highly doped process layer 438. A mask layer is deposited on the process surface 102a and patterned by photolithographic means to form an impurity mask with mask sections 532. The mask sections 532 may be parallel rips or equally spaced columns, by way of example. P-type impurities are introduced, for example implanted, into the exposed portions of the process surface 102a up to a second depth greater than the first depth.

Figure 5B:
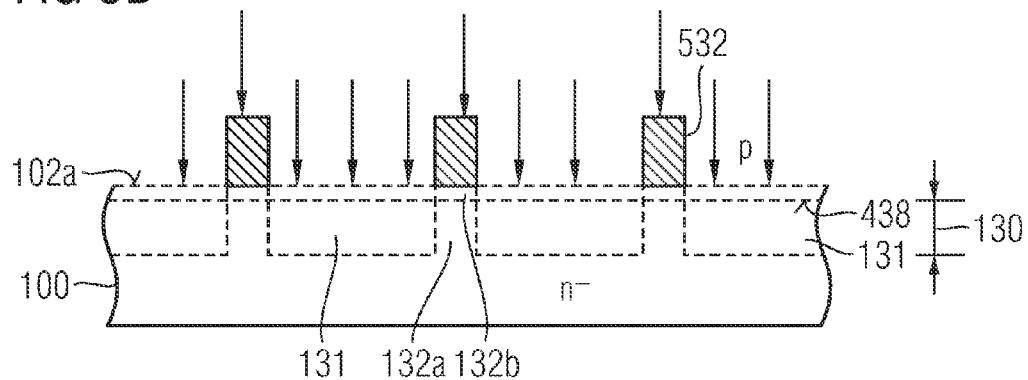
FIG. 5B shows the semiconductor substrate of FIG. 5A after a masked implant with p-type impurities.

FIG. 5B shows portions of the process layer 438 of FIG. 5A below the mask sections 532 forming highly doped portions 132a of channels 132. Between the mask sections 532 p-type emitter zones 131 extend into the semiconductor portion 100 below the process layer 438. Exposed portions of the process layer 438 are heavily n and p doped. The heavily n and p doped portions of the process layer 438 above the emitter zones 131 are removed, for example by an etch process using the impurity mask sections 532 as an etch mask.

Figure 5C:
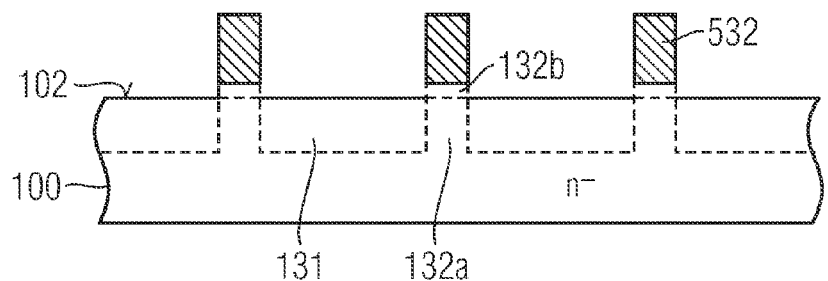
FIG. 5C shows the semiconductor substrate of FIG. 5B after an etch using the impurity mask as an etch mask.

FIG. 5C shows the remaining highly doped emitter zones 131 uncovered by the preceding etch process. An LTA (laser thermal anneal) is performed, wherein the substrate 100 is heated up and may be melted in a target depth m1 with regard to the second surface 102. The target depth m1 is between the second surface 102 and a buried edge of the emitter zones 131 given by a second depth m2. For example, the target depth m1 may be about the half of the second depth m2. The anneal locally diffuses impurities of the second conductivity type out from the emitter zones 131 into adjoining portions of the low doped channel portions 132a.

Figure 5D:
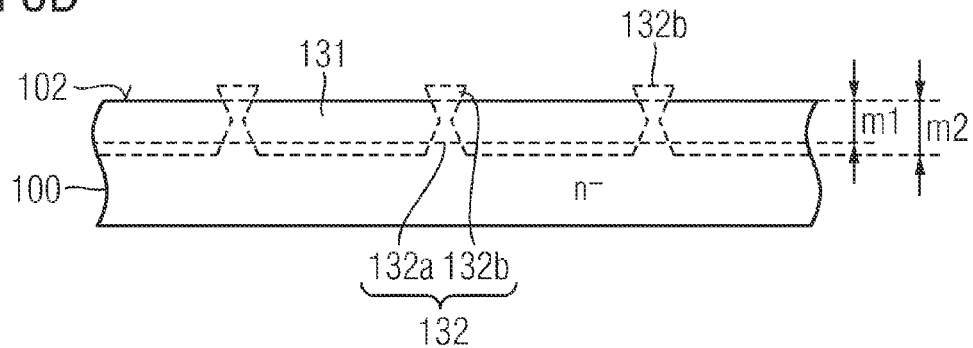
FIG. 5D shows the semiconductor substrate of FIG. 5C after a laser thermal anneal.

FIG. 5D shows the finalized channels 132 with lateral contradictions whose distance to the second surface 102 is defined by the target depth m1 of the LTA.

Figure 6:
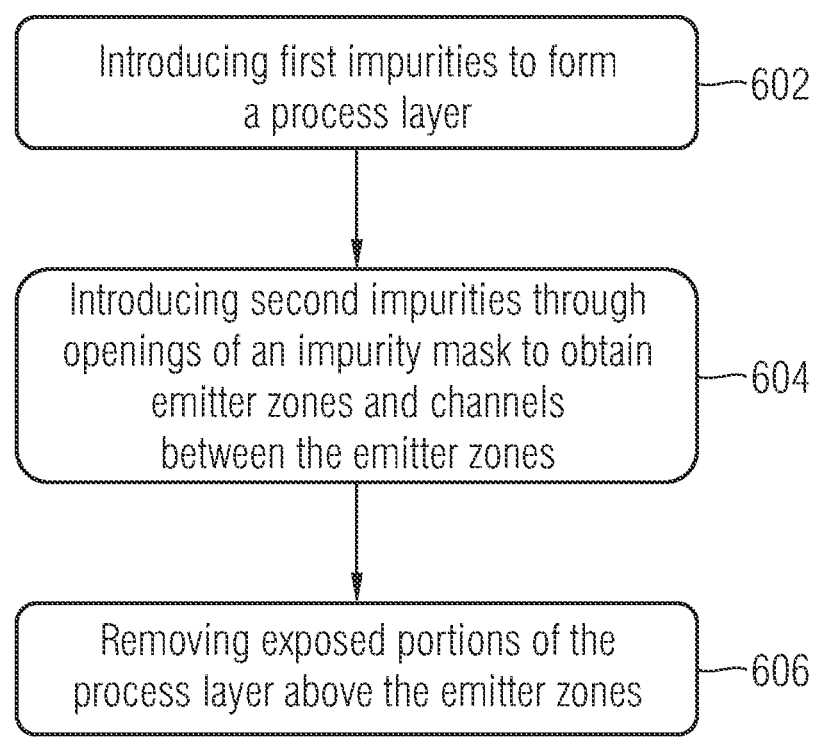
FIG. 6 is a simplified flow-chart for illustrating a method of manufacturing a semiconductor device in accordance with a further embodiment.

FIG. 6 refers to a method of manufacturing a reverse blocking semiconductor device. Impurities of a first conductivity type are introduced into a semiconductor substrate of the first conductivity type through a process surface to obtain a process layer extending into the semiconductor substrate up to a first depth (602). Through openings of an impurity mask provided on the process surface impurities of a second, complementary conductivity type are introduced into the semiconductor substrate to obtain emitter zones extending into the semiconductor substrate up to a second depth, which is greater than the first depth (604). Between the emitter zones channels of the first conductivity type are formed. Exposed portions of the process layer above the emitter zones are removed (606). The process may follow a thinning of the semiconductor substrate to a target thickness.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A reverse blocking semiconductor device, comprising:
    a collector electrode;
    a base region of a first conductivity type and a body region of a second complementary conductivity type, the base and body regions forming a pn junction; and
    an emitter layer arranged between the base region and the collector electrode and comprising emitter zones of the second conductivity type and a channel of the first conductivity type,
    wherein the channel extends through the emitter layer between the base region and the collector electrode and at least a vertical section of the channel is completely depleted in a reverse blocking state of the reverse blocking semiconductor device.

2. The reverse blocking semiconductor device according to claim 1, wherein
    the first conductivity type is n-type and at least a vertical section of the channel is completely depleted when a negative voltage is applied between the collector electrode and the base region.

3. The reverse blocking semiconductor device according to claim 1, comprising:
    a control portion configured to control a current through the body region.

4. The reverse blocking semiconductor device according to claim 1, wherein
    the channel is completely depleted in an idle state with 0 Volts applied between the collector electrode and the body region.

5. The reverse blocking semiconductor device according to claim 1, wherein
in a vertical section of the channel, an integral over the net impurity concentration in the channel along a line parallel to the second surface results in an area charge of at most $5\times10^{10}$ cm$^{-2}$.

6. The reverse blocking semiconductor device according to claim 1, wherein
a mean net impurity concentration in the channel is between $5\times10^{13}$ cm$^{-3}$ and $1\times10^{15}$ cm$^{-3}$.

7. The reverse blocking semiconductor device according to claim 1, wherein
a width of a narrowest vertical section of the channel is at most 1 µm.

8. The reverse blocking semiconductor device according to claim 1, wherein
the channel comprises a low-doped portion and a heavily doped portion sandwiched between the low-doped portion and the collector electrode.

9. The reverse blocking semiconductor device according to claim 1, wherein
the channel comprises a low-doped portion directly adjoining the collector electrode.

10. The reverse blocking semiconductor device according to claim 9, wherein
the low-doped portion and the collector electrode form a Schottky contact.

11. The reverse blocking semiconductor device according to claim 1, wherein
the channel comprises a low doped portion, a Schottky contact and an additional layer formed between the low-doped portion and the Schottky contact, and a mean net impurity concentration in the additional layer exceeds a mean net impurity concentration in the low-doped portion, the Schottky contact is formed by the collector electrode and the additional layer or by the collector electrode and a spacer zone provided between the additional layer and the collector electrode.

12. The reverse blocking semiconductor device according to claim 11, wherein a mean net impurity concentration in the additional layer exceeds a mean net impurity concentration in the spacer zone.

13. The reverse blocking semiconductor device according to claim 1, wherein
a channel population density is lower in a first section of the emitter layer than in a second section of the emitter layer.

14. The reverse blocking semiconductor device according to claim 13, wherein
the first and second sections are provided in a cell area.

15. The reverse blocking semiconductor device according to claim 13, wherein
the first section is provided in a cell area and the second section is provided in an edge area surrounding the cell area.

16. The reverse blocking semiconductor device according to claim 13, wherein
in a transition section between the first and second sections, the channel population density gradually decreases towards the second section.

17. A reverse blocking semiconductor device comprising:
a collector electrode;
a base region of a first conductivity type and a body region of a second complementary conductivity type, the base and body regions forming a pn junction; and
an emitter layer arranged between the base region and the collector electrode and comprising emitter zones of the second conductivity type and channels of the first conductivity type, the channels extending through the emitter layer between the base region and the collector electrode, wherein
a channel population density in a first section of the emitter layer is lower than in a second section.

18. The reverse blocking semiconductor device according to claim 17, wherein
the channels form Schottky contacts with the collector electrode.

19. The reverse blocking semiconductor device according to claim 17, wherein
the first and second sections are provided in a cell area.

20. The reverse blocking semiconductor device according to claim 17, wherein
the first section is provided in a cell area and the second section is provided in an edge area surrounding the cell area.

21. The reverse blocking semiconductor device according to claim 17, wherein
in a transition section between the first and second sections, the channel population density gradually decreases towards the second section.

* * * * *